(12) United States Patent
Kawasaki et al.

(10) Patent No.: US 8,859,389 B2
(45) Date of Patent: Oct. 14, 2014

(54) METHODS OF MAKING FINS AND FIN FIELD EFFECT TRANSISTORS (FINFETS)

(75) Inventors: Hirohisa Kawasaki, Ballston Spa, NY (US); Basker Veeraraghavan, Albany, NY (US); Hemant Adhikari, Albany, NY (US); Witold Maszara, Morgan Hill, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/015,857

(22) Filed: Jan. 28, 2011

(65) Prior Publication Data

US 2012/0193751 A1 Aug. 2, 2012

(51) Int. Cl.
| | | |
|---|---|---|
| H01L 21/76 | (2006.01) | |
| H01L 21/336 | (2006.01) | |
| H01L 21/8234 | (2006.01) | |
| H01L 29/66 | (2006.01) | |
| H01L 29/78 | (2006.01) | |

(52) U.S. Cl.
CPC ........ H01L 29/66795 (2013.01); H01L 29/785 (2013.01)
USPC .................... 438/425; 438/197; 257/E29.264

(58) Field of Classification Search
USPC ................ 257/506, E21.09, E29.02; 438/425
See application file for complete search history.

(56) References Cited

U.S. PATENT DOCUMENTS

| 4,735,824 A * | 4/1988 | Yamabe et al. ................ 427/79 |
|---|---|---|
| 5,998,231 A * | 12/1999 | Yamamoto ..................... 438/41 |
| 6,630,714 B2 | 10/2003 | Sato et al. |
| 6,800,518 B2 | 10/2004 | Bendernagel et al. |
| 2005/0199920 A1 * | 9/2005 | Lee et al. ...................... 257/288 |
| 2007/0221956 A1 * | 9/2007 | Inaba ............................ 257/197 |
| 2008/0135949 A1 * | 6/2008 | Lo et al. ........................ 257/401 |
| 2009/0004831 A1 * | 1/2009 | Chu et al. ..................... 438/479 |
| 2009/0256208 A1 * | 10/2009 | Okano .......................... 257/365 |

FOREIGN PATENT DOCUMENTS

| JP | 2005122272 | 12/2005 |
|---|---|---|
| JP | 2007258485 | 10/2007 |
| JP | 2009259865 | 11/2009 |

OTHER PUBLICATIONS

Hisamoto, et al.; A Fully Depleted Lean-channel Transistor (DELTA)—A novel vertical ultra thin SOI MOSFET—; 1989, pp. 34.5.1-34.5.4.

* cited by examiner

*Primary Examiner* — William F Kraig
*Assistant Examiner* — Khaja Ahmad
(74) *Attorney, Agent, or Firm* — White & Case LLP

(57) ABSTRACT

Methods of making fins and semiconductor structures containing fins are provided. The methods involve forming a multi-layer structure over a semiconductor substrate. The multi-layer structure comprises a first layer over the semiconductor substrate, a second layer over the first layer, and a third layer over the second layer. The method also comprises removing upper portions of the semiconductor substrate and portions of the multi-layer structure to form fins of the semiconductor substrate and portions of the multi-layer structure. Further, the method comprises selectively oxidizing the first layer while oxidization of the second layer and the third layer is less than the oxidization of the first layer. The oxidation can be performed before gap fill recess or after gap fill recess.

15 Claims, 6 Drawing Sheets

METHODS OF MAKING FINS AND FIN FIELD EFFECT TRANSISTORS (FINFETS)

FIELD

The following description relates generally to fins and methods of making fins on a semiconductor device.

BACKGROUND

As transistor design is improved and evolved, the number of different types of transistors continues to increase. Multi-gate fin field effect transistors (e.g., FinFETs) are developed to provide scaled devices with faster drive currents and reduced short channel effects over planar FETs. One feature of the FinFET is that the conducting channel is wrapped around a thin silicon "fin," which forms the body of the device. The dimensions of the fin can determine the effective channel length of the device. The term "FinFET" is used generically to describe any fin-based, multi-gate transistor architecture regardless of number of gates. Examples of multi-gate fin field effect transistors include double-gate FinFETs and tri-gate FinFETs.

Double-gate FinFETs are FETs in which a channel region is formed in a thin semiconductor fin. The source and drain regions are formed in the opposing ends of the fin on either side of the channel region. Gates are formed on each side of the thin semiconductor fin, and in some cases, on the top or bottom of the fin as well, in an area corresponding to the channel region. FinFETs are generally a type of double-gate fin FETs in which the fin is so thin as to be fully depleted.

Tri-gate FinFETs have a similar structure to that of double-gate FinFETs. The fin width and height of the tri-gate FinFETs, however, are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate FinFET will give greater drive current and improved short-channel characteristics over a planar transistor.

DETAILED DESCRIPTION

Figure 1:
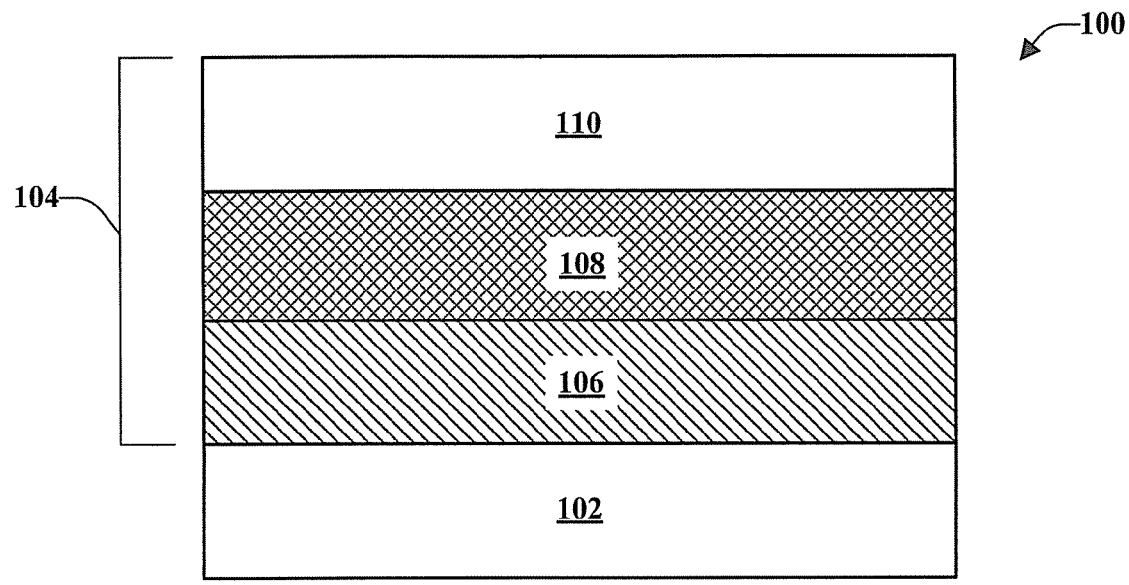
FIG. 1 illustrates a cross sectional view of layers of an exemplary FinFET, according to an aspect.

The subject innovation provides fins having improved variation of fin height and methods of forming the fins. The fin can be used for semiconductor structures including semiconductor transistors. In one embodiment, the subject innovation provides fins for FinFETs having improved variation of fin height and methods of forming the fins for FinFETs. Certain FinFETs have fins and a shallow trench isolation (STI) between the fins. In such FinFETs, the fin height above the upper surface of the STI is determined in part by a height of the STI or a depth of a recess of a STI region (e.g., STI recess). The subject innovation provides a selective oxidation process that can provide FinFETs having improved characteristics of a substantially uniform fin height, wherein the fin height is defined as a function of a thickness of one or more layers of the semiconductor structure.

The subject innovation provides for generation of a Si-fin structure on dielectric material using a Bulk-Si (silicon) substrate. A Si-fin can be electrically isolated from the Si-substrate. Further, the structure can be similar to a structure created by a silicon-on-insulator (SOI)-substrate. The disclosed aspects provide selective SiGe (silicon-germanium) oxidation. By controlling one or more oxidation conditions, a SiGe layer can be selectively oxidized while a Si layer is oxidized only slightly. The disclosed aspects do not need a complex scheme such as using a SiN spacer to cover the Si channel when oxidization is executed. Further, in the disclosed aspects, the SiGe oxidation can be performed before STI fill, which can mitigate the uncertainty of fin height definition. Thus, fin height can be decided by the thickness of Si, which is formed on the SiGe layer. According to some aspects, the SiGe oxidation can be performed after STI fill. The height uniformity can be robust regardless of the STI recess process, which usually defines the fin height.

Other advantages of the disclosed aspects over conventional Bulk-Si FinFETs include mitigation of a fin height variation, wherein the fin height is decided by a controllable process. Another advantage includes a fin height that can be shorter than a fin height of conventional Bulk-Si FinFET due to the presence of a SiGe oxide layer. Further advantages include mitigation of a gate leakage path due to the presence of the SiGe oxide layer. Another advantage includes the presence of an undoped channel, which can enhance transistor performance.

The subject innovation involves a method of forming fins. The method comprises forming a multi-layer structure over a semiconductor substrate. The multi-layer structure comprises a first layer over the semiconductor substrate, a second layer over the first layer, and a third layer over the second layer. The method also comprises removing upper portions of the semiconductor substrate and portions of the multi-layer structure to form fins of the semiconductor substrate and portions of the multi-layer structure. Further, the method comprises selectively oxidizing the first layer while oxidization of the second layer and the third layer is less than the oxidization of the first layer. According to an embodiment, the method can include filling gaps between the fins with an insulating material and recessing at least a portion of the insulating material to expose a fin. At least one of side-surfaces of the fin or a top surface of the fin become channel areas.

The subject innovation also involves a method of forming a shallow trench isolation recess. The method comprises growing a multi-layer structure comprising three or more layers over a semiconductor substrate and removing upper portions of the semiconductor substrate and portions of the multi-layer structure, thereby forming fins. The method also comprises forming isolation material between the fins, selectively oxidizing at least a portion of the fins, and performing an etching process to remove at least a layer of isolation material to expose an underlying layer. Alternatively, the method can comprise forming isolation material between the fins before selectively oxidizing at least a portion of the fins.

Further, the subject innovation involves a semiconductor structure comprising a semiconductor substrate comprising fins and portions of a multi-layer structure comprising three or more layers over the fins. The multi-layer structure comprises one or more layers between a lowermost layer and an uppermost layer. The one or more layers have at least one layer formed from silicon-geranium that is selectively oxidized. The semiconductor structure also comprises isolation material between the fins over the semiconductor structure.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Turning now to the figures, FIG. 1 illustrates a cross sectional view of layers of an exemplary FinFET 100, according to an aspect. The FinFet 100 can contain a semiconductor substrate 102 and a multi-layer structure 104 over the semiconductor substrate 102. According to an aspect, the semiconductor substrate is a bulk-Si substrate.

One or more of the layers of the multi-layer structure 104 can be formed by chemical vapor deposition (CVD) such as plasma enhanced chemical vapor deposition (PECVD), low-pressure chemical vapor deposition (LPCVD), high-pressure chemical vapor deposition (HPCVD), or the like.

The multi-layer structure 104 can contain N layers, where N is an integer, which is three or more. Although the multi-layer structure can contain three or more layers, for the purpose of brevity, FIG. 1 illustrates a multi-layer structure containing three layers. In one embodiment, the multi-layer structure contains a first layer 106 or a lowermost layer over the semiconductor substrate 102, a second layer 108 or an intermediate layer over the first layer, and a third layer 110 or an uppermost layer over the second layer.

One or more of the layers of the multi-layer structure 104 can contain dielectric materials including oxides such as silicon oxide; nitrides such as silicon nitride, silicon rich nitride, and oxygen rich silicon nitride; and the like. According to an embodiment, the first layer 106 contains silicon-geranium (SiGe). According to some embodiments, the second layer 108 contains silicon. For example, a SiGe layer can be grown on a silicon substrate and a silicon layer can be grown on the SiGe layer. During the growing process, the silicon thickness can be controlled, wherein the silicon thickness determines a fin height ($H_{fin}$). The SiGe layer will turn into an insulator film later in the process during oxidization (as will be described below).

The thicknesses of the layers of the multi-layer structure 104 may vary and the layers independently have any suitable thickness that depends on the desired implementations of the FinFET being fabricated. In one embodiment, the thickness of the second layer is about 10 nm or more and about 100 nm or less. In another embodiment, the thickness of the second layer is about 15 nm or more and about 80 nm or less. In yet another embodiment, the thickness of the second layer is about 20 nm or more and about 60 nm or less. In still yet another embodiment, the thickness of the second layer is about 30 nm.

In one embodiment, a thickness of the third layer is about 5 nm or more and about 100 nm or less. In another embodiment, the thickness of the third layer is about 7 nm or more and about 60 nm or less. In yet another embodiment, the thickness of the third layer is about 10 nm or more and about 40 nm or less. In still yet another embodiment, the thickness of the third layer is about 14 nm.

An Nth layer or an uppermost layer of the multi-layer structure can be a cap layer. The Nth layer can serve as a chemical-mechanical polishing (CMP) stop layer in a subsequent process. The Nth layer can contain dielectric materials including oxides such as silicon oxide; nitrides such as silicon nitride, silicon rich nitride, and oxygen rich silicon nitride; and the like. The Nth layer can be formed by CVD such as PECVD, LPCVD, HPCVD, or the like.

The multi-layer structure can have one or more intermediate layers between the first layer (or a lowermost layer) and the Nth layer (or an uppermost layer). At least one intermediate layer can have a substantially uniform thickness across the semiconductor substrate. The intermediate layer can be formed by CVD such as PECVD, LPCVD, HPCVD, or the like.

Figure 2:
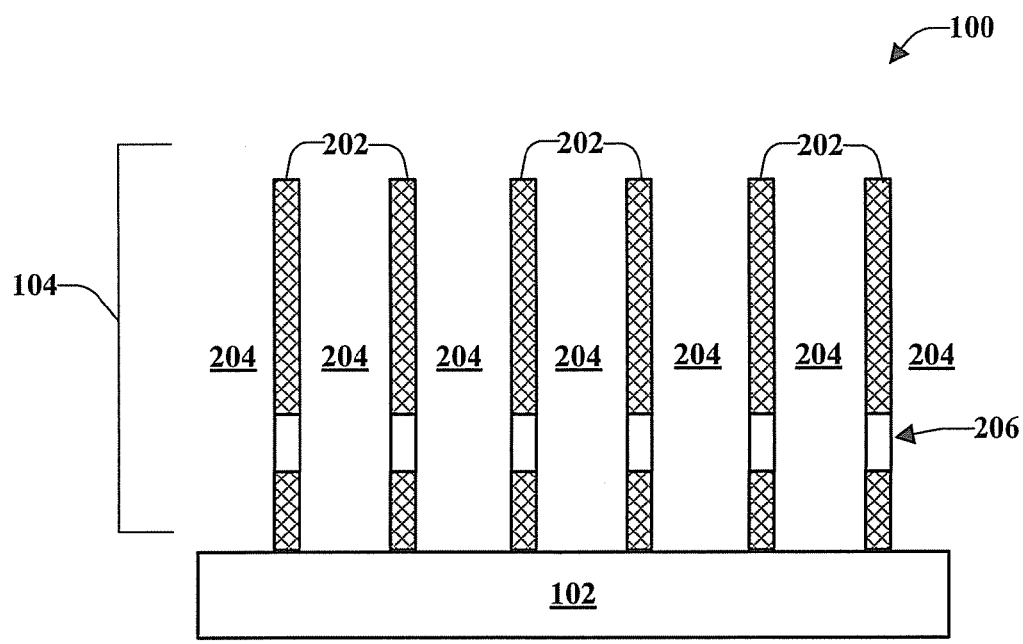
FIG. 2 illustrates removing upper portions of a semiconductor substrate and portions of a multi-layer structure to form fins, according to an aspect.

FIG. 2 illustrates removing upper portions of the semiconductor substrate 102 and portions of the multi-layer structure 104, to form fins 202 of the semiconductor substrate 102 and portions of the multi-layer structure 104. Although six thin fins are shown in FIG. 2, the FinFET 100 can contain any suitable number of fins depending on a type of the transistors being fabricated. Gaps 204 are formed between the fins 202. As shown, the fins 202 comprise a SiGe layer 206.

The fins 202 and the portions of the multi-layer structure can be formed by removing portions of the semiconductor substrate and the multi-layer structure. The portions of the semiconductor substrate and the multi-layer structure can be removed by any suitable technique, for example, etching. Portions of the semiconductor substrate and the multi-layer structure can be removed by contacting the semiconductor substrate and the multi-layer structure with any suitable etchant that does not substantially damage and/or remove other components of the FinFET 100. Choice of a suitable process and reagents of etching depends on, for example, the materials of the semiconductor substrate and the multi-layer structure, the width and height of the fins, the desired implementations of the FinFET structure 100 being fabricated, and the like.

Ion doping can be introduced into the channel region before gate formation. The ion doping can mitigate an amount of leakage current that exists in the region. The source and drain regions can be formed after gate formation, according to an aspect. Source and drain regions can be formed in the opposing ends of the fin on either side of the channel region. For example, a simplified process flow can include fin formation and then SiGe oxidation. After SiGe oxidation, STI fill is performed and then planarization of STI fill material. Next, the STI fill material is recessed and ion doping into the fin may occur. Gate material deposition is followed by gate formation and then spacer formation. Extension of ion implantation occurs before final spacer formation and then source/drain formation. This is followed by silicidation and then back end of line processing.

In accordance with some aspects, SiGe oxidation is performed after the gap fill recess. For example, in a simplified version, fins are formed and then STI fill and planarization of STI fill material is performed. Next, the STI fill material is recessed and SiGe oxidation is performed. After SiGe oxidation, ion doping into the fin occurs. Gate material deposition is followed by gate formation and then spacer formation. Extension of ion implantation occurs before final spacer formation and then source/drain formation. This is followed by silicidation and back end of line processing.

In the above aspect where SiGe oxidation is performed after the gap fill recess, an air gap forms between a bottom of the SiGe oxidation and the recessed gap fill material. This can occur when the surface of the recessed gap fill material is below the bottom of the SiGe layer and SiGe oxide in the neighboring fins merge.

Wet etching and/or dry etching containing isotropic etching and/or anisotropic etching can be employed. Examples of wet etchants for silicon of the semiconductor substrate include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching (RIE) using, for example, a mixture gas containing HBr (e.g., HBr and $O_2$ mixture gas, $HBr/NF_3/He$ and $O_2$ mixture gas, $SF_6$, HBr and $O_2$ mixture gas). The mixture may further include $Cl_2$.

The fin has any suitable width that depends on the desired implementations of the FinFET structure 100 being fabricated. The width may vary and is not critical to the subject innovation. All of the fins have the same width, or some of or all of the fins have a different width from each other. Although FIG. 2 illustrates the fins having a rectangular cross-section, the fins can have a generally trapezoidal cross-section, or a cross-section with some other shape.

In one embodiment, the width of the fin is about 5 nm or more and about 30 nm or less. In another embodiment, the width of the fin is about 10 nm or more and about 20 nm or less. In yet another embodiment, the width of the fin is about 12 nm or more and about 18 nm or less. In still yet another embodiment, the width of the fin is about 15 nm.

A fin pitch of the fins can be any suitable length that depends on the desired implementations of the FinFET structure 100 being fabricated. The fin pitch may vary and are not critical to the subject innovation. All of the fin pitches have the same length, or some of or all of the fin pitches have a different length from each other. In one embodiment, the fin pitch is about 15 nm or more and about 70 nm or less. In another embodiment, the fin pitch is about 25 mu or more and about 50 mu or less. In yet another embodiment, the fin pitch is about 30 nm or more and about 40 nm or less. In still yet another embodiment, the fin pitch is about 35 nm.

Any suitable fin height can be designed by adjusting the FinFET structure 100 being fabricated. The height is controllable and is not critical to the subject innovation. According to an aspect, the height is determined by a thickness of at least one layer of the multi-layer structure. For example, the fin height can be determined by a Si layer that is formed over a SiGe layer, wherein a thickness of either or both layers is controlled.

All of the fins have the same height, or some of or all of the fins have a different height from each other. In one embodiment, the height of the fin is about 5 nm or more and about 80 nm or less. In another embodiment, the height of the fin is about 10 nm or more and about 70 nm or less. In yet another embodiment, the height of the fin is about 15 mu or more and about 60 nm or less.

Figure 3:
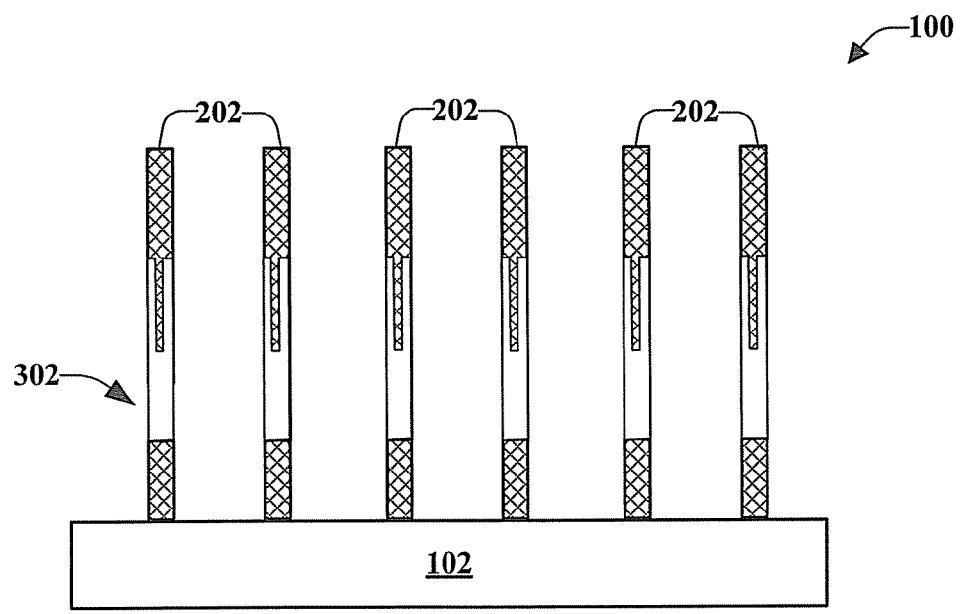
FIG. 3 illustrates selective oxidization of the FinFET, according to an aspect.

FIG. 3 illustrates selective oxidization of the FinFET 100, according to an aspect. The selective oxidization can include oxidizing a first layer (e.g., a SiGe layer) and only slightly oxidizing at least one other layer (e.g., a Si layer or other layers) of the multi-layer structure. According to an embodiment, the selective oxidization is performed in an atmosphere containing chlorine. As a result of the selective oxidization, the SiGe layer can become a SGO layer 302. In some embodiments, the selective oxidization is stopped before the first layer (e.g., SiGe layer) is fully oxidized. According to an embodiment, the oxidization is performed for up to about 30 minutes. According to another embodiment, the oxidization is performed for up to about 20 minutes. In yet another embodiment, the oxidization is performed for up to about 5 minutes.

Further, the oxidization can be performed at various temperatures. In an embodiment, the oxidation is performed at a temperature range between about 500 and 800 degrees Celsius. In another embodiment, the oxidization is performed at a temperature range between about 550 and 750 degrees Celsius. In another embodiment, the oxidization is performed at a temperature of about 600 degrees Celsius.

Figure 4:
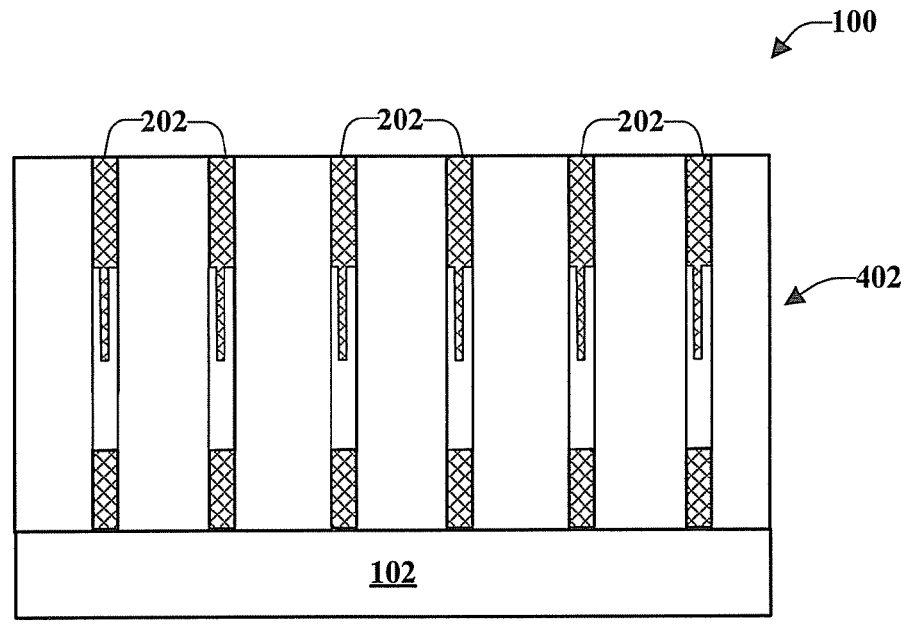
FIG. 4 illustrates gaps between the fins being filled with isolation material, according to an aspect.
Figure 5:
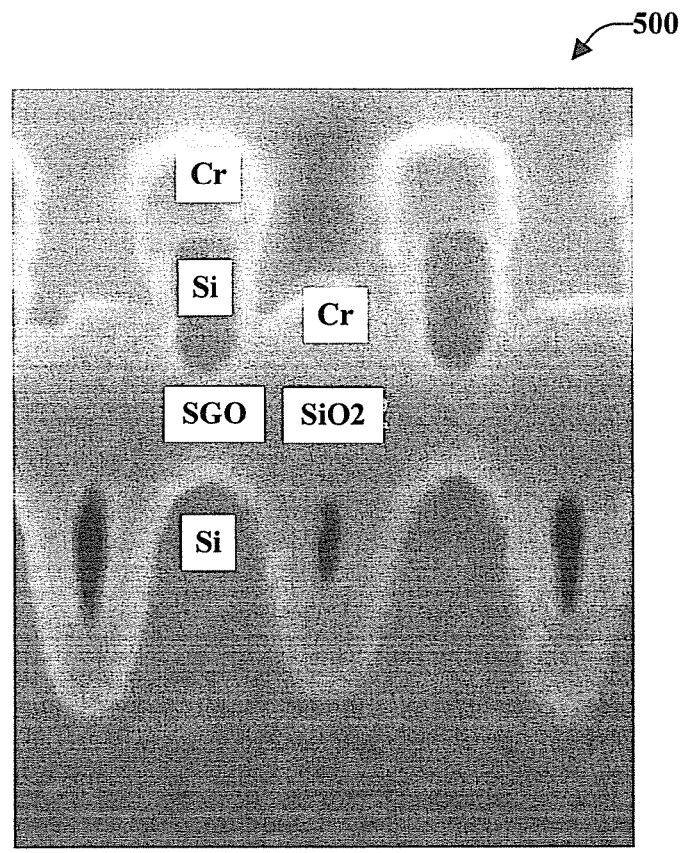
FIG. 5 illustrates an image of a portion of a FinFET, wherein an original SiGe layer is turning into a SiGeOxide (SGO) layer, according to an aspect.

FIG. 4 illustrates the gaps 204 between the fins 202 filled with isolation material 402. The isolation material 402 can contain any suitable insulating material such as oxides (e.g., silicon oxides) and nitrides (e.g., silicon nitrides). According to an embodiment, the insulating material is $SiO_2$ (silicon dioxide). FIG. 5 shows an image of a portion of a FinFET 500, wherein the original SiGe layer is turning into the SiGeOxide (SGO) layer and Si fin is electrically separated from the Si substrate by the SGO film.

The isolation material can be formed by any suitable technique. For example, an insulating layer is formed over the semiconductor substrate 102 and an upper portion of the insulating layer is removed, thereby leaving the isolation material 402 between at least a portion of the fins 202.

The insulating layer can be formed by any suitable technique including CVD such as PECVD, LPCVD, HPCVD, or the like. An upper portion of the insulating layer can be removed by CMP and/or etching (e.g., RIE). For example, an upper portion of the insulating layer is polished by CMP down to the upper surface of the uppermost layer of the multi-layer structure (e.g., the upper surface of the portions of the third layer). In another example, the insulating layer is polished by CMP down to another layer (e.g., a lower layer).

Figure 6:
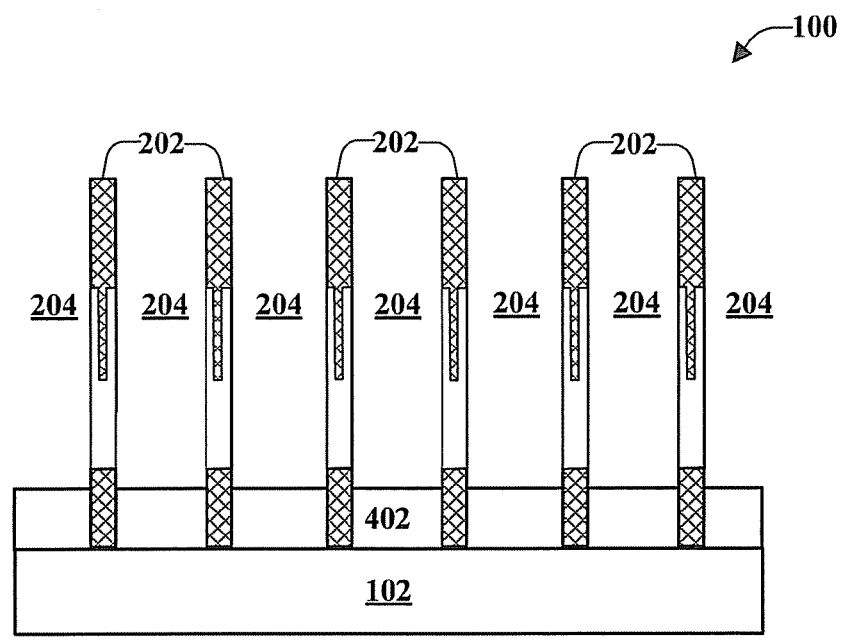
FIG. 6 illustrates at least a portion of the insulating material recessed to expose a fin, according to an aspect.

As shown in FIG. 6, at least a portion of the insulating material is recessed to expose a fin. In an embodiment, the insulating layer can be removed via an etching process. The removal of the insulating layer can expose one or more fins 202. In accordance with some aspects, the removal of the insulating material exposes at least a portion of a Si layer.

Figure 7:
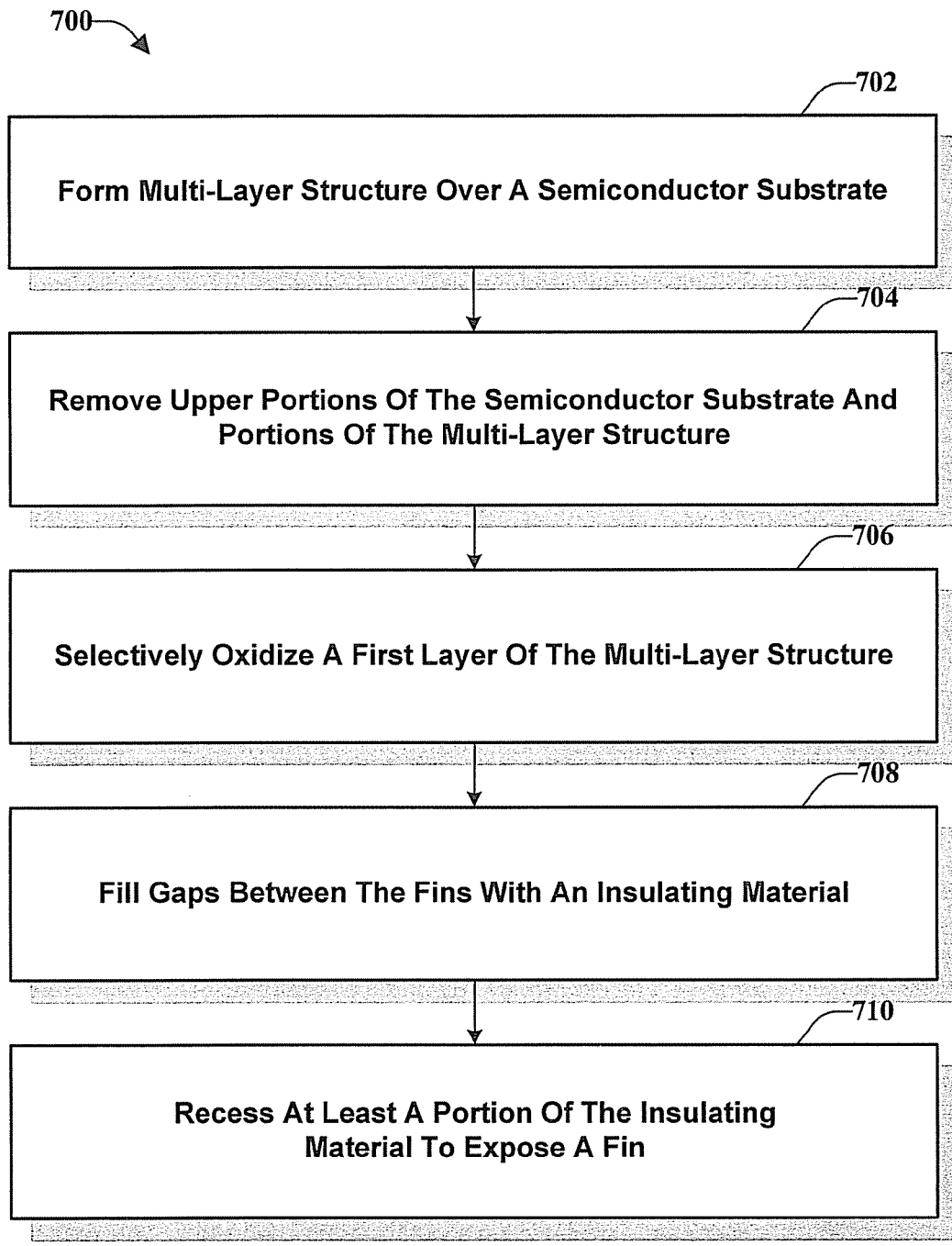
FIG. 7 illustrates an exemplary process of forming fins, according to an aspect.

FIG. 7 illustrates an exemplary process 700 of forming fins, according to an aspect. At 702, a multi-layer structure is formed over a semiconductor substrate. The multi-layer structure comprises a first layer over the semiconductor substrate, a second layer over the first layer, and a third layer over the second layer. According to an embodiment, the semiconductor substrate is a bulk-Si substrate. The first layer can comprise silicon-geranium. The second layer and the third layer can be epitaxially grown.

Upper portions of the semiconductor substrate and portions of the multi-layer structure are removed, at 704, to form fins of the semiconductor substrate and portions of the multi-layer structure. In an embodiment, thickness of the second layer and/or the third layer are controlled, wherein a thickness of at least one of the second layer and third layer control a fin height.

The first layer is selectively oxidized, at 706. Oxidization of the first layer can be conducted while oxidization of second layer and third layer is minimized (e.g., the oxidization of the second and third layer is less than the oxidization of the first layer). The oxidization can be stopped before the first layer is fully oxidized. In an embodiment, the oxidization is performed in an atmosphere containing chlorine.

According to an embodiment, the oxidization is performed for up to about 30 minutes. According to another embodiment, the oxidization is performed for up to about 20 minutes. In yet another embodiment, the oxidization is performed for up to about 5 minutes.

The oxidization can be performed at various temperatures. In an embodiment, the oxidation is performed at a temperature range between about 500 and 800 degrees Celsius. In another embodiment, the oxidation is performed at a temperature range between about 550 and 750 degrees Celsius. In another embodiment, the oxidation is performed at a temperature of about 600 degrees Celsius.

The method 700 can also include, at 708, filling gaps between the fins with an insulating material and, at 710, recessing at least a portion of the insulating material to expose a fin. Filling the gaps can provide insulation of a Si-fin channel and supporting substrate. In an embodiment, the insulating material is silicon dioxide. In accordance with some aspects, side-surfaces of the fin and/or a top surface of the fin become channel areas. In accordance with some aspects, the selective oxidization is performed after the gaps are filled.

Figure 8:
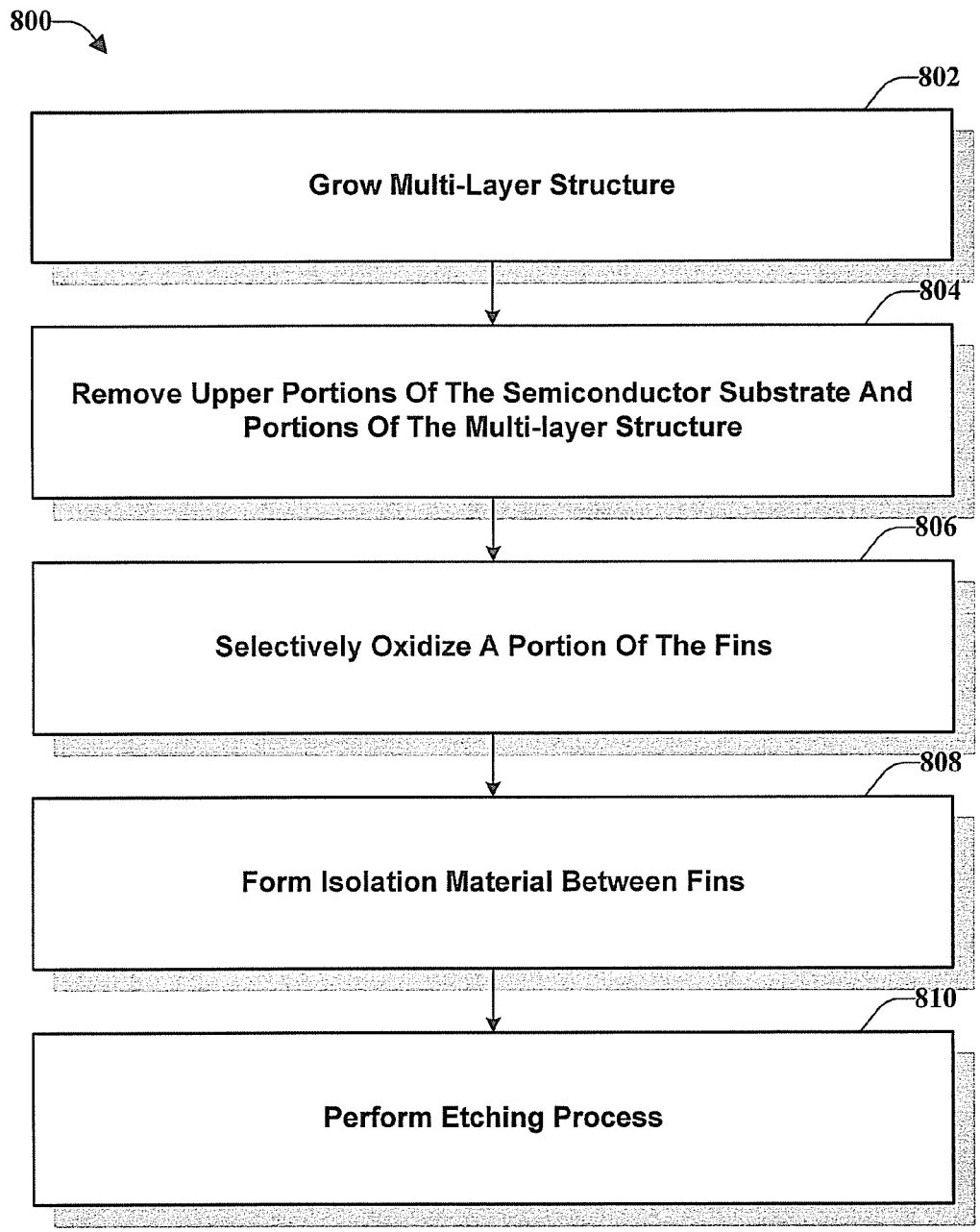
FIG. 8 illustrates an exemplary process of forming a shallow trench isolation recess, according to an aspect.

FIG. 8 illustrates an exemplary process 800 of forming a shallow trench isolation recess, according to an aspect. At 802, a multi-layer structure comprising three or more layers is grown over a semiconductor substrate. The growing can comprise growing the multi-layer structure that comprises at least one layer comprising silicon-germanium. At 804, upper portions of the semiconductor substrate and portions of the multi-layer structure are removed, thereby forming fins.

At least a portion of the fins is selectively oxidized, at 806. The selective oxidization can comprise stopping the oxidization before the first layer of the multi-layer structure is fully oxidized. At 808, isolation material is formed between the fins. The isolation material can comprise silicon dioxide and the forming can comprise forming silicon dioxide between the fins. At 810, an etching process is performed to remove at least a layer of isolation material to expose an underlying layer.

Figure 9:
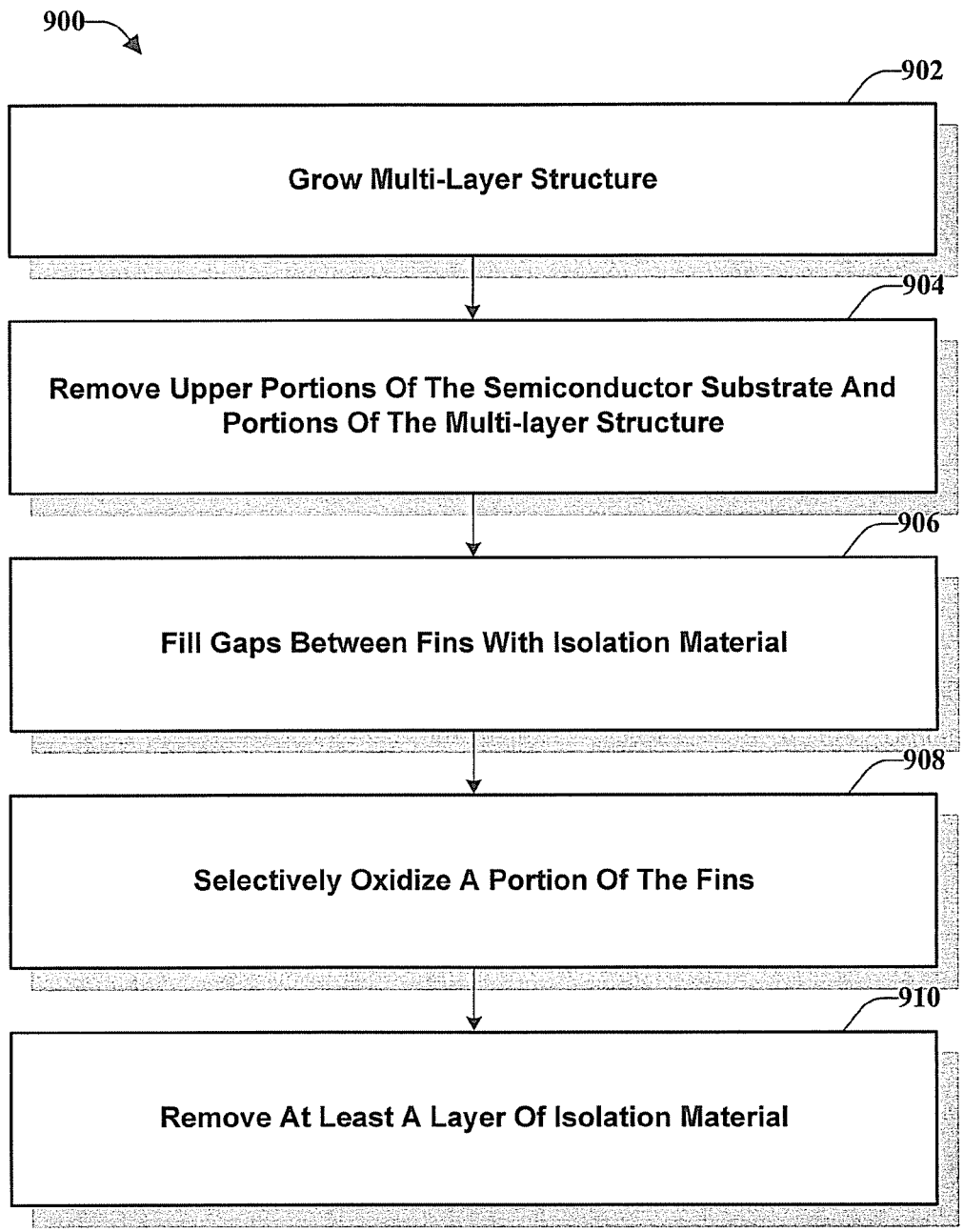
FIG. 9 illustrates another exemplary process of forming a shallow trench isolation recess, according to an aspect.

FIG. 9 illustrates another exemplary process 900 of forming a shallow trench isolation recess, according to an aspect. This process 900 comprises SiGe oxidation that is performed after gap fill recess. At 902, a multi-layer structure is grown over a semiconductor substrate. The multi-layer structure can include three or more layers. The growing can comprise growing the multi-layer structure that comprises at least one layer comprising silicon-germanium. At 904, upper portions of the semiconductor substrate and portions of the multi-layer structure are removed. The removal process can form fins.

At 906, gaps between the fins are filled with isolation material. The isolation material can comprise silicon dioxide. At least a portion of the fins is selectively oxidized, at 908. The selective oxidization can comprise stopping the oxidization before the first layer of the multi-layer structure is fully oxidized. At 910, at least a layer of isolation material is removed to expose an underlying layer. Removal of the isolation material can comprise an etching process.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

What is claimed is:

1. A method of forming fins, comprising:
   forming a multi-layer structure over a semiconductor substrate, the multi-layer structure comprises a silicon-germanium layer as a first layer over the semiconductor substrate, a silicon layer as a second layer over the first layer, and a third layer over the second layer wherein the silicon layer is electrically in contact with the semiconductor substrate via the silicon-germanium layer;
   removing upper portions of the semiconductor substrate and portions of the multi-layer structure to form fins of the semiconductor substrate and portions of the multi-layer structure; selectively oxidizing the silicon-germanium layer while oxidization of the second layer is less than the oxidization of the first layer, wherein the silicon-germanium layer is turned into a SiGeOxide layer and wherein the silicon layer is electrically separated from the semiconductor substrate by the SiGeOxide layer;
   filling gaps between the fins with an insulating material after the selectively oxidizing; and
   recessing at least a portion of the insulating material to expose a fin, wherein at least a side surface of the second layer or a top surface of the fin is exposed, and at least a part of side surfaces of the SiGeOxide layer is uncovered from the recessed insulating material.

2. The method of claim 1, the selectively oxidizing comprises stopping the oxidization before the first layer is fully oxidized.

3. The method of claim 1, the selectively oxidizing is conducted for up to about 30 minutes.

4. The method of claim 1, the selectively oxidizing is performed at a temperature range between about 500 and 800 degrees Celsius.

5. The method of claim 1, the selectively oxidizing is performed in an atmosphere containing chlorine.

6. The method of claim 1, the semiconductor substrate is a bulk-Si substrate.

7. The method of claim 1, further comprising controlling a thickness of the second layer and the third layer.

8. The method of claim 1, the filling provides insulation of a Si-fin channel and supporting substrate.

9. The method of claim 1, the insulating material is silicon dioxide.

10. The method of claim 1, the second layer and the third layer are epitaxially grown.

11. A method of forming a shallow trench isolation recess, comprising:
    growing a multi-layer structure comprising three or more layers over a semiconductor substrate wherein the three layers are a silicon-germanium layer as a first layer over the semiconductor substrate, a silicon layer as a second layer over the first layer, and a third layer over the second layer and wherein the silicon layer is electrically in contact with the semiconductor substrate via the silicon-germanium layer;

removing upper portions of the semiconductor substrate and portions of the multi-layer structure, thereby forming fins;

forming isolation material between the fins;

selectively oxidizing at least a portion of the fins, comprising:

selectively oxidizing the silicon-germanium layer while oxidization of the second layer is less than the oxidization of the first layer, wherein the silicon-germanium layer is turned into a SiGeOxide layer, and wherein the silicon layer is electrically separated from the semiconductor substrate by the SiGeOxide layer; and performing an etching process to remove at least a layer of isolation material to expose an underlying layer, wherein at least a part of side surfaces of the SiGeOxide layer and at least a side surface of the second layer are exposed from the isolation material.

12. The method of claim 11, the selectively oxidizing comprises stopping the oxidization before a first layer of the multi-layer structure is fully oxidized.

13. The method of claim 11, the forming comprises forming silicon dioxide between the fins.

14. The method of claim 1, a part of the silicon layer is oxidized during the selectively oxidizing the silicon-germanium layer.

15. The method of claim 11, a part of the silicon layer is oxidized during selectively oxidizing the at least the portion of the fins.

* * * * *